(12) United States Patent
Nishida

(10) Patent No.: US 9,378,997 B2
(45) Date of Patent: Jun. 28, 2016

(54) SUBSTRATE HOLDING MECHANISM, SUBSTRATE TRANSPORTING DEVICE, AND SEMICONDUCTOR MANUFACTURING APPARATUS

(71) Applicant: EBARA CORPORATION, Tokyo (JP)

(72) Inventor: Hiroaki Nishida, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 14/670,749

(22) Filed: Mar. 27, 2015

(65) Prior Publication Data

US 2015/0279719 A1 Oct. 1, 2015

(30) Foreign Application Priority Data

Mar. 31, 2014 (JP) ................. 2014-073804

(51) Int. Cl.
*H01L 21/687* (2006.01)

(52) U.S. Cl.
CPC .... *H01L 21/68707* (2013.01); *H01L 21/68728* (2013.01)

(58) Field of Classification Search
USPC ............ 294/213, 103.1, 106, 119.1; 414/941, 414/752.1; 901/30, 31, 39
See application file for complete search history.

(56) References Cited

U.S. PATENT DOCUMENTS

| | | | | |
|---|---|---|---|---|
| 5,004,399 A * | 4/1991 | Sullivan | ................... | B25J 15/00 414/225.01 |
| 5,746,460 A * | 5/1998 | Marohl | ............. | H01L 21/68707 294/213 |
| 6,216,883 B1 * | 4/2001 | Kobayashi | ........ | H01L 21/68707 118/728 |
| 6,256,555 B1 * | 7/2001 | Bacchi | .............. | H01L 21/68707 294/185 |
| 6,322,116 B1 * | 11/2001 | Stevens | ..................... | B25B 9/00 294/64.3 |
| 6,454,332 B1 * | 9/2002 | Govzman | .............. | H01L 21/681 294/103.1 |
| 6,629,883 B2 * | 10/2003 | Katsuoka | .............. | B24B 37/345 451/332 |
| 6,678,581 B2 * | 1/2004 | Hung | ................ | H01L 21/68707 118/228 |
| 6,909,276 B2 * | 6/2005 | Hofer | ................... | B25J 15/0004 257/E21.525 |
| 2003/0172956 A1 * | 9/2003 | Hashi | ................... | G11B 23/505 134/2 |
| 2006/0078839 A1 * | 4/2006 | Adachi | ............. | H01L 21/67103 432/258 |
| 2007/0216179 A1 * | 9/2007 | Hirooka | ............ | H01L 21/68707 294/103.1 |
| 2009/0067959 A1 | 3/2009 | Takahashi et al. | | |
| 2011/0241367 A1 * | 10/2011 | Hosek | ............... | H01L 21/67742 294/213 |

FOREIGN PATENT DOCUMENTS

WO 2007/099976 A1 9/2007

* cited by examiner

*Primary Examiner* — Paul T Chin

(74) *Attorney, Agent, or Firm* — Pearne & Gordon LLP

(57) ABSTRACT

A substrate holding mechanism includes a substrate holding claw for holding the substrate. The substrate holding claw includes a slant face for sliding the substrate thereon. Height of the slant face is increased from the inside of a space for holding the substrate toward the outside of the space. A crossing angle formed by a direction in which a machining mark is formed on the slant face and a direction in which the substrate is slid is not less than 0 degree and not more than 45 degrees at least in a partial region of the slant face.

8 Claims, 9 Drawing Sheets

SUBSTRATE HOLDING MECHANISM, SUBSTRATE TRANSPORTING DEVICE, AND SEMICONDUCTOR MANUFACTURING APPARATUS

CROSS-REFERENCE TO RELATED APPLICATION

This application claims priority on Patent Application No. 2014-073804 filed in Japan on Mar. 31, 2014, the disclosure of which is hereby incorporated by reference herein in its entirety.

TECHNICAL FIELD

The present invention relates to a technique of transporting a substrate.

BACKGROUND ART

In a semiconductor manufacturing apparatus, when a substrate, for example, a wafer is transported, there is a case where: the wafer is fixed by a holding part (substrate holding claw) so as to prevent the wafer from being moved; and then is transported. In this case, one of the methods of fixing a wafer is fixing a wafer by sandwiching the wafer from one side or both sides. This method of fixing the wafer, in many cases, employs a structure in which an edge portion of the wafer is received by a holding part slanted to an obverse surface or a reverse surface of the wafer in order to minimize a portion in contact with the wafer. In this structure, when the wafer is sandwiched, the slanted holding part and the edge portion of the wafer slide relatively to each other. At this time, depending on the shape of surface of the holding part or the edge portion of the wafer, there is a case where: the wafer is not slid smoothly on the holding part; but is caught in the middle of the holding part. When the wafer is caught in the holding part in this manner, there is a case where a failure of the wafer to be fixed or damage to the wafer is caused. From these problems, it is desirable that the surface of the holding part is machined smoothly so as to decrease bumps and dents to the utmost to thereby reduce friction. Further, it is desirable that the shape of the edge portion of the wafer is machined in a shape in which the edge portion is hard to be caught in the holding part.

In the SEMI standard, the shape of an edge portion of a wafer is defined within a range having an allowance, so if necessary, within the range of the SEMI standard, the shape of the edge portion can be changed into a shape in which the edge portion is hard to be caught in the holding part. For this reason, in the conventional art, as far as the wafer based on the SEMI standard is used, if the holding part is machined in roughness of some extent, the wafer is slid smoothly and hence the failure of the wafer to be fixed or damage to the wafer is hardly caused.

However, in recent years, in a three-dimensional lamination technique of a semiconductor, there is a case where a wafer whose edge portion has a shape sharper than a wafer based on the SEMI standard is used. For example, in a wafer having a structure in which a thin silicon wafer is held by a glass substrate, it is difficult to machine its edge portion in a round shape. In this wafer, when a holding part in the conventional art is used, the wafer is not slid smoothly and hence the failure of the wafer to be fixed or damage to the wafer is caused. As a method of preventing this problem can be smoothly finishing the surface of the holding part by more accurate machining, but the method requires a longer time for machining the holding part, which hence presents problems of a reduction in productivity and an increase in cost. As another method of preventing the problem can be forming a smooth surface on the holding part by die forming, but if a considerable number of holding parts are not mass-produced, the method increases a manufacturing cost.

SUMMARY

According to one embodiment of the present invention, there is provided a substrate holding mechanism. The substrate holding mechanism includes a substrate holding claw for holding a substrate. The substrate holding claw includes a slant face for sliding the substrate thereon. Height of the slant face is increased from the inside of a space for holding the substrate toward the outside of the space. A crossing angle formed by a direction in which a machining mark is formed on the slant face and a direction in which the substrate is slid is not less than 0 degree and not more than 45 degrees at least in a partial region of the slant face.

DESCRIPTION OF EMBODIMENTS

Figure 1:
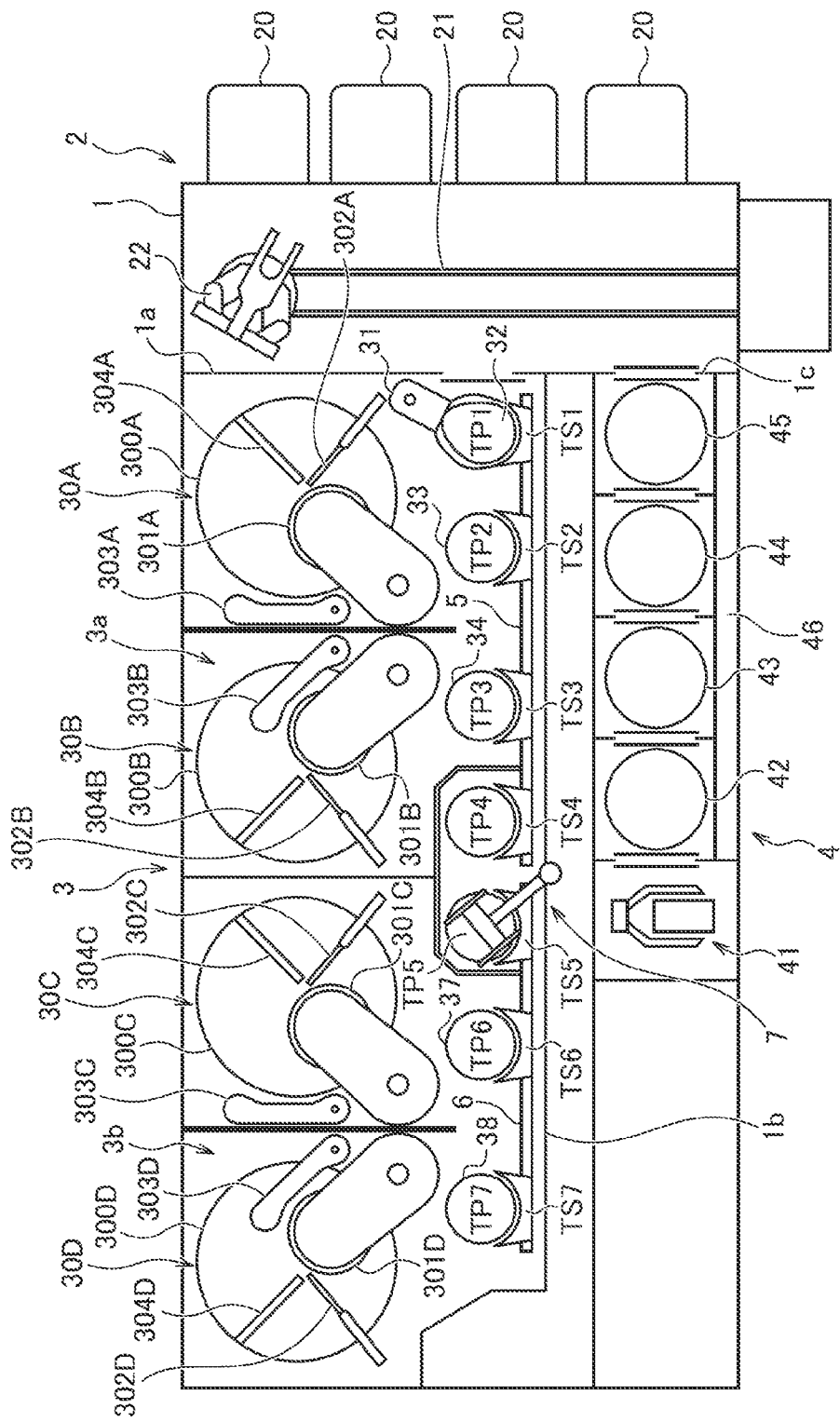
FIG. 1 is a plan view to show a schematic construction of a substrate polishing device as an embodiment of the present invention.

According to a first embodiment of the present invention, there is provided a substrate holding mechanism. This substrate holding mechanism includes a substrate holding claw for holding the substrate. The substrate holding claw includes a slant face for sliding the substrate thereon. Height of the slant face is increased from the inside of a space for holding the substrate toward the outside of the space. A crossing angle formed by a direction in which a machining mark is formed on the slant face and a direction in which the substrate is slid is not less than 0 degree and not more than 45 degrees at least in a partial region of the slant face.

According to this substrate holding mechanism, when the substrate placed on the slant face of the substrate holding claw is sandwiched from one side or both sides by the substrate holding claws while sliding the substrate on the slant face, the machining mark is hard to operate as a stepped portion in which the substrate is caught when the substrate is slid. For this reason, the substrate holding mechanism can reduce the probability of occurrence of a failure of the substrate to be fixed or damage to the substrate from being caused by the substrate being caught in the machining mark. In addition, the surface of the slant face of the substrate holding claw does not need to be finished smoothly by accurate machining, so that the substrate holding claw can be manufactured at a low cost and at a high productivity.

According to a second embodiment of the present invention, in the first embodiment, the crossing angle is not more than 30 degrees. According to this embodiment, the effects of the first embodiment can be improved.

According to a third embodiment of the present invention, in the first embodiment, the crossing angle is 0 degree. According to this embodiment, the effects of the first embodiment can be improved to the maximum.

According to a fourth embodiment of the present invention, in any one of the first to the third embodiments, the machining mark is formed in parallel to a direction in which the slant face is slanted. According to this embodiment, the substrate holding claw can be easily manufactured.

According to a fifth embodiment of the present invention, there is provided a substrate turnover device including the substrate holding mechanism of any one of the first to the fourth embodiments. According to a sixth embodiment of the present invention, there is provided a substrate transporting device including the substrate holding mechanism of any one of the first to the fourth embodiments. According to a seventh embodiment of the present invention, there is provided a semiconductor manufacturing apparatus including the substrate holding mechanism of any one of the first to the fourth embodiments. According to these embodiments, the same effects as any one of the first to the fourth embodiments can be produced.

In addition to the embodiments described above, the embodiments of the invention can be various embodiments including machining method of substrate holding claw. Hereinafter, more detailed exemplary embodiments of the present invention will be described with reference to the drawings.

FIG. 1 is a plan view to show a general construction of a CMP polishing device as one example of the semiconductor manufacturing apparatus according to the embodiment of the present invention. As shown in FIG. 1, the CMP polishing device includes a generally rectangular housing 1 and the interior of the housing 1 is partitioned into a loading/unloading section 2, a polishing section 3 (3a, 3b), and a cleaning section 4 by partition walls 1a, 1b, 1c. The loading/unloading section 2, the polishing sections 3a, 3b, and the cleaning section 4 are assembled independently of each other and are exhausted independently of each other.

The loading/unloading section 2 includes two or more (four in the present embodiment) front loading portions 20 which put a wafer cassette stocking a wafer as a kind of the substrate (hereinafter also referred to simply as wafer) thereon. These front loading portions 20 are arranged adjacent to each other in a width direction (a direction perpendicular to a longitudinal direction) of the CMP polishing device. The front loading portion 20 can include an open cassette, a SMIF (Standard Manufacturing Interface) pod, or a FOUP (Front Opening Unified Pod) mounted thereon.

The polishing section 3 is a region in which the wafer is polished and includes a first polishing portion 3a, which includes a first polishing unit 30A and a second polishing unit 30B provided therein, and a second polishing portion 3b, which includes a third polishing unit 30C and a fourth polishing unit 30D provided therein. The first polishing unit 30A, the second polishing unit 30B, the third polishing unit 30C, and the fourth polishing unit 30D are arranged along the longitudinal direction of the device.

The first polishing unit 30A includes a polishing table 300A having a polishing surface, a top ring 301A for holding a wafer and polishing the wafer while pressing the wafer onto the polishing table 300A, a polishing liquid supply nozzle 302A for supplying the polishing table 300A with a polishing liquid or a dressing liquid (for example, water), a dresser 303A for dressing the polishing table 300A, and an atomizer 304A for atomizing a mixed fluid of liquid (for example, pure water) and gas (for example, nitrogen gas) or liquid (for example, pure water) to thereby spray the atomized fluid or liquid to the polishing surface from one nozzle or a plurality of nozzles. Similarly, the polishing units 30B, 30C, 30D include polishing tables 300B, 300C, 300D, top rings 301B, 301C, 301D, polishing liquid supply nozzles 302B, 302C, 302D, dressers 303B, 303C, 303D, and atomizers 304B, 304C, 304D, respectively.

A first linear transporter 5 as a substrate transporting device is disposed between the first polishing unit 30A and the second polishing unit 30B of the first polishing section 3a and the cleaning section 4. The first linear transporter 5 transports the wafer between four transportation positions (which are referred to as a first transportation position TP1, a second transportation position TP2, a third transportation position TP3, and a fourth transportation position TP4 in the order from the loading/unloading section 2 side) along the longitudinal direction. A turnover device 31 is disposed above the first transportation position TP1 of the first linear transporter 5. The turnover device 31 turns over the wafer received from a transportation robot 22 moving on a traveling mechanism 21 of the loading/unloading section 2. A lifter 32 is disposed below the turnover device 31. The lifter 32 is capable of moving up and down. Further, a pusher 33 capable of moving up and down is disposed below the second transportation position TP2, and a pusher 34 capable of moving up and down is disposed below the third transportation position TP3.

Further, in the second polishing section 3b, a second linear transporter 6 as a substrate transporting device is disposed adjacent to the first linear transporter 5. The second linear transporter 6 transports the wafer between three transportation positions (which are referred to as a fifth transportation position TP5, a sixth transportation position TP6, and a seventh transportation position TP7 in the order from the loading/unloading section 2 side) along the longitudinal direction. A pusher 37 is disposed below the sixth transportation position TP6, and a pusher 38 is disposed below the seventh transportation position TP7.

The cleaning section 4 is a region for cleaning the polished wafer and includes a turnover device 41 for turning over the wafer, four cleaning devices 42 to 45 for cleaning the polished wafer, and a transportation unit 46 for transporting the wafer between the turnover device 41 and the cleaning devices 42 to 45. The turnover device 41 and the cleaning devices 42 to 45 are arranged in series along the longitudinal direction.

A swing transporter 7 is disposed between the first linear transporter 5 and the second linear transporter 6. The swing transporter 7 transports the wafer between the first linear transporter 5, the second linear transporter 6, and the turnover device 41 of the cleaning section 4. The swing transporter 7 can transport the wafer from the fourth transportation position TP4 of the first linear transporter 5 to the fifth transportation position TP5 of the second linear transporter 6, from the fifth transportation position TP5 of the second linear transporter 6 to the turnover device 41, and from the fourth transportation position TP4 of the first linear transporter 5 to the turnover device 41, respectively.

Although transportation stages TS1, TS2, TS3 on a lower step and transportation stage TS4 on an upper step seem to move on the same axis on the plan view of FIG. 1, they are different from each other in height at which they are arranged. Hence, the transportation stages TS1, TS2, TS3 on the lower step and the transportation stages TS4 on the upper step can be freely moved without interfering with each other. The first transportation stage TS1 transports the wafer between the first transportation position TP1 at which the turnover device 31 and the lifter 32 are arranged and the second transportation position TP2 at which the pusher 33 is arranged (which is a position at which the wafer is received and delivered), the second transportation stage TS2 transports the wafer between the second transportation position TP2 and the third transportation position TP3 at which the pusher 34 is arranged (which is a position at which the wafer is received and delivered), and the third transportation stage TS3 transports the wafer between the third transportation position TP3 and the fourth transportation position TP4. Further, the fourth transportation stage TS4 transports the wafer between the first transportation position TP1 and the fourth transportation position TP4.

Figure 2:
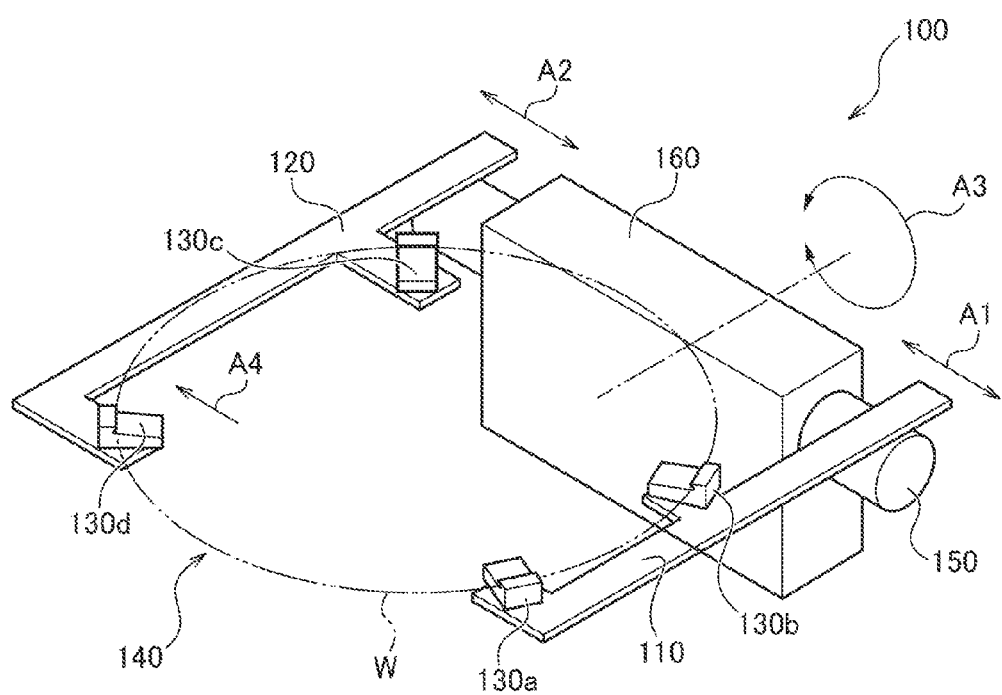
FIG. 2 is an illustrative view to show a schematic construction of a substrate holding mechanism.

FIG. 2 shows a schematic construction of a substrate holding mechanism 100 used for the turnover devices 31, 41. The substrate holding mechanism 100 includes a pair of arms 110, 120, four substrate holding claws 130a to 130d, a shaft 150, and an opening/closing mechanism 160. The arms 110, 120 are fixed to both ends of the shaft 150 in parallel to each other. The substrate holding claws 130a, 130b are fixed to a distal end side and to a proximal end side (shaft 150 side) of arm 110, respectively. Similarly, the substrate holding claws 130c, 130d are fixed to a distal end side and to a proximal end side of arm 120. The substrate holding claws 130a to 130d will be later described in detail. In the following description, in a case where the substrate holding claws 130a to 130d are not distinguished from each other, the substrate holding claw may be designated by the use of a reference number "130."

The opening/closing mechanism 160 extends and contracts the shaft 150 in its axial direction. By the opening/closing mechanism 160, the arms 110, 120 are configured to be movable in a direction in which they come near to each other and in a direction in which they go away from each other, as shown by arrows A1, A2. Between the arm 110 and the arm 120 is formed a space 140 for holding the wafer W.

In this substrate holding mechanism 100, a wafer W is arranged on the substrate holding claws 130a to 130d in a state where the arms 110, 120 are remote from each other and then the arms 110, 120 are moved in a direction in which they come near to each other, whereby the wafer W is held by the arms 110, 120 via the substrate holding claws 130a to 130d. In a state where the wafer W is held in this manner, when the opening/closing mechanism 160 is, consequently, the arms 110, 120 and the wafer W are turned over 180 degrees by a rotation mechanism (omitted in the drawing), the wafer W is turned over.

Figure 3:
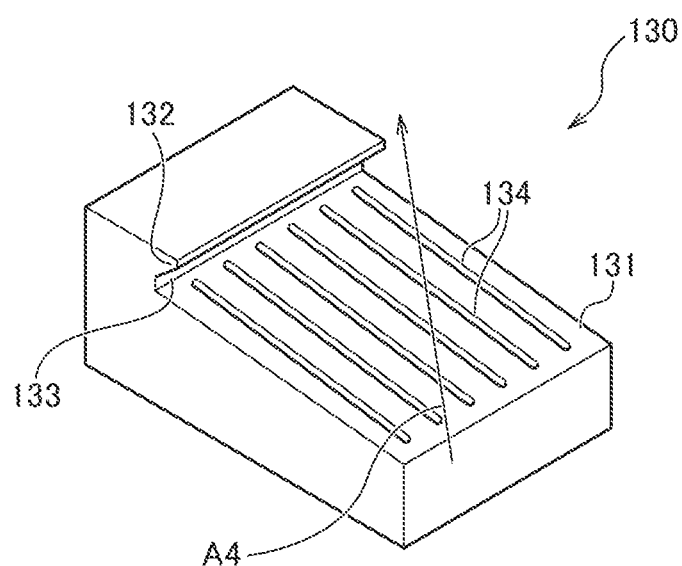
FIG. 3 is an illustrative view to show a schematic shape of a substrate holding claw.

FIG. 3 shows a shape of the substrate holding claw 130. As shown in FIG. 3, the substrate holding claw 130 includes a slant face 131 on a side opposite to the arms 110, 120. The slant face 131 has its height increased gradually from the inside of the space 140 for holding the wafer W to the outside of the space 140, that is, from the inside of the wafer W in a state where the wafer W is arranged on the substrate holding claw 130 to the outside of the wafer W. Further, the substrate holding claw 130 includes a protruding portion 132. The protruding portion 132 protrudes toward the inside at a position higher than the slant face 131. Between the slant face 131 and the protruding portion 132 is formed a face 133 that is a bottom face of a concave portion formed by the slant face 131 and the protruding portion 132.

In the above-mentioned procedure of holding the wafer W, first, the wafer W is arranged on the slant face 131. Next, the arm 110 and the arm 120 are moved in a direction in which they come near to each other. At this time, the wafer W is slid on the slant face 131 and is finally held in a state where an edge portion of the wafer W abuts on the face 133.

In the present embodiment, as shown in FIG. 2, the respective substrate holding claws 130a to 130d are oriented so as to face the center of the wafer W in a state where the wafer W is held by the substrate holding claws 130a to 130d, that is, in such a way that the slant of the slant face 131 is formed along a radial direction. On the other hand, when the arms 110, 120 hold the wafer W, the arms 110, 120 are moved in a direction in which they come near to each other while keeping a state where they are parallel to each other. For this reason, the wafer W is slid on the slant face 131 in a direction forming a specific angle with respect to a direction in which the slant face 131 is slanted. For example, in the substrate holding claw 130d, the wafer W is slid in a direction shown by an arrow A4 (see FIG. 2, FIG. 3).

As shown in FIG. 3, in the present embodiment, when the slant face 131 is formed (when the substrate holding claw 130 is formed from a work), machining marks 134 are formed on the slant face 131 of the substrate holding claw 130. In the present embodiment, the machining marks 134 are formed in parallel to a direction in which the slant face 131 is slanted. The machining marks 134 are formed linearly in such a way as to cross a direction in which the wafer W is slid (direction shown by the arrow A4) at an angle of 30 degrees.

Figure 4A:
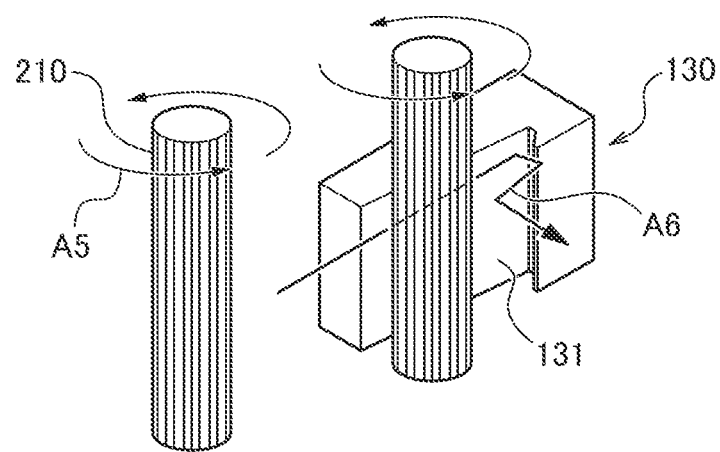
FIGS. 4A and 4B are illustrative views to show a method for manufacturing a substrate holding claw.
Figure 4B:
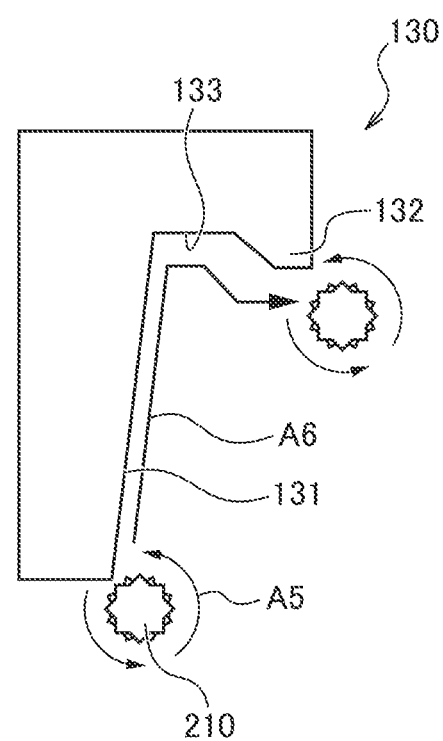

FIG. 4A and FIG. 4B show an example of a method for manufacturing the substrate holding claw 130. In this example, an end mill 210 rotating in an axial direction (direction shown by an arrow A5) is moved along the shape of the substrate holding claw 130, that is, along an arrow A6 in such a way that the slant face 131, the face 133, and the protruding portion 132 are formed, whereby the work is cut and hence the substrate holding claw 130 is formed. In other words, the end mill 210 is moved along a direction in which the slant face 131 is slanted. The machining marks 134 shown in FIG. 3 are formed by this machining method. In place of the end mill 210, a reamer may be used. For example, the substrate holding claw 130 is formed by a lathe machining and then a surface finishing may be applied to the slant face 131 by a reamer.

In the present embodiment, as described above, the substrate holding claw 130 is formed in such a way that the machining marks 134 are formed in parallel to a direction in which the slant face 131 is slanted, so that the substrate holding claw 130 can be easily manufactured. However, a direction in which the machining marks 134 are formed and a direction in which the slant face 131 is slanted may cross each other at an arbitrary angle.

Figure 5A:
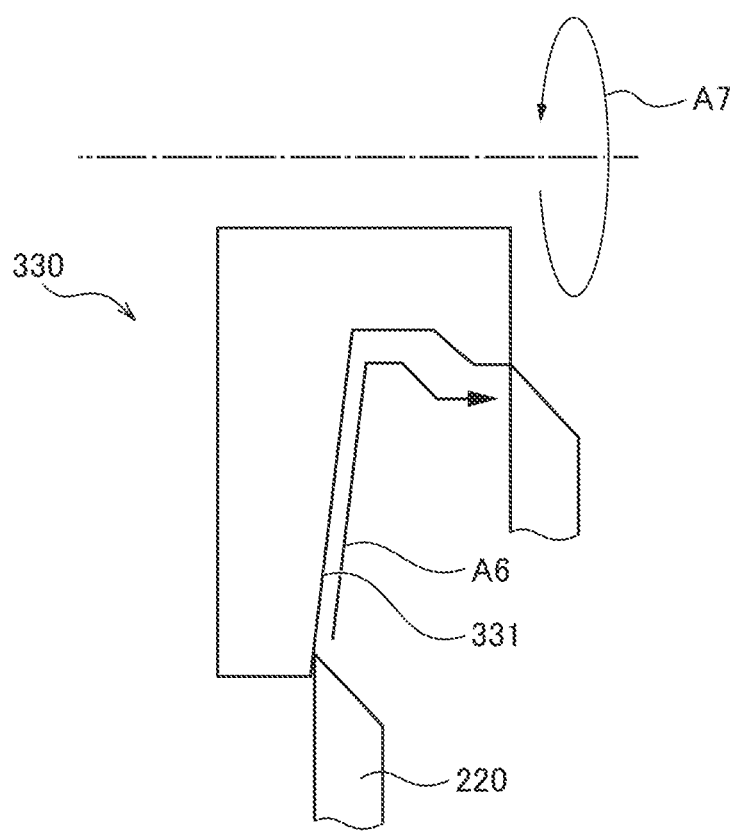
FIGS. 5A and 5B are illustrative views to show a method for manufacturing a substrate holding claw and a shape of the substrate holding claw in the prior art.
Figure 5B:
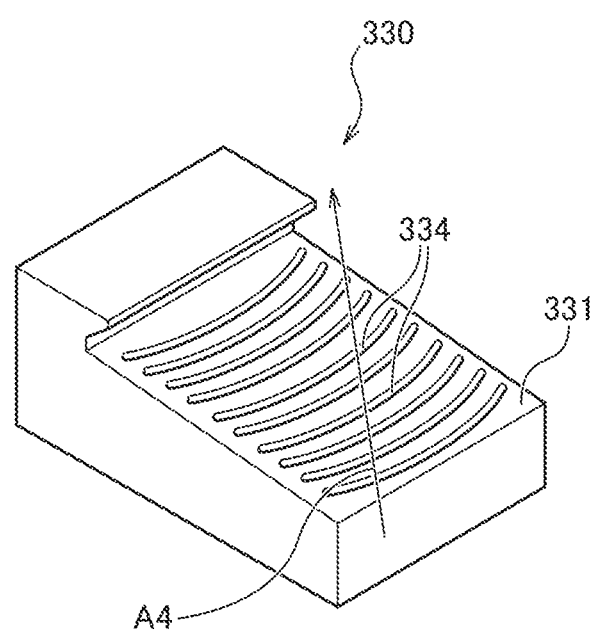

FIG. 5A and FIG. 5B show a method for manufacturing a substrate holding claw 330 as an example in the prior art. In this example, the substrate holding claw 330 having the same shape as the substrate holding claw 130 is formed by the lathe machining. In this case, a bite 220 is moved in a direction shown by an arrow A6 (same direction as the arrow A6 shown in FIG. 4A and FIG. 4B) in a state where a work is rotated in a direction shown by an arrow A7. In this case, machining marks 334 each having the shape of a circular arc are formed on a slant face 331 of the substrate holding claw 330 in a direction approximately perpendicular to a direction in which the slant face 331 is slanted. For this reason, in a case where the substrate holding claw 330 is used in the same direction as the substrate holding claw 130, the machining marks 334 cross a direction in which the wafer W is slid (direction of the arrow A4) at an angle of 60 degrees or more at an arbitrary position.

Figure 6A:
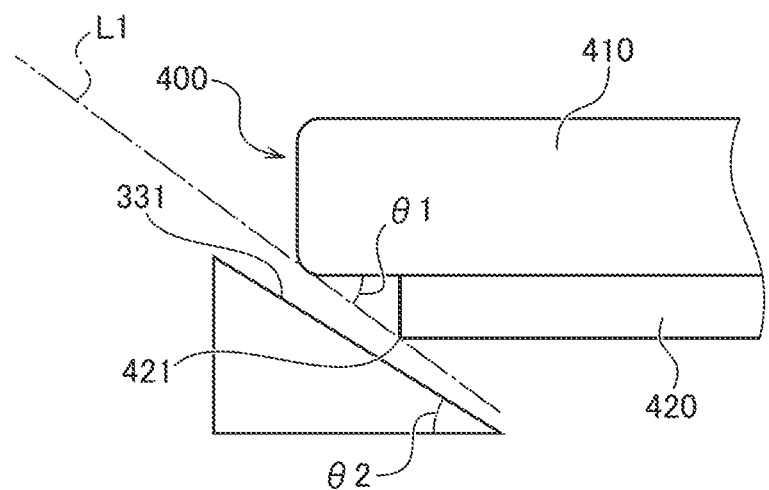
FIGS. 6A and 6B are illustrative views to show a shape of a substrate.
Figure 6B:
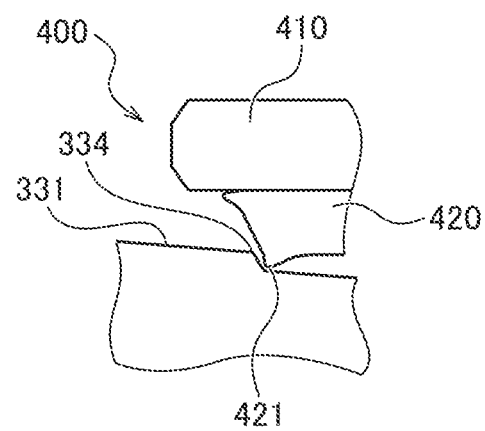

FIG. 6A and FIG. 6B show an example of a shape of a substrate. In FIG. 6A and FIG. 6B is shown a case in which a substrate 400 is held by the use of the substrate holding claw 330 having the machining marks 334 shown in FIG. 5B. As shown in FIG. 6A, the substrate 400 is constructed by a thin silicon wafer 420 being held on a glass substrate 410. An edge portion of the glass substrate 410 is formed so as to have a round shape. On the other hand, the silicon wafer 420 is very thin, so it is difficult to machine a corner portion of the silicon wafer 420 in a round shape. Hence, the silicon wafer 420 has a sharp corner portion 421 formed in an edge portion thereof.

Here, when it is assumed that: in a section of the substrate 400, a line in contact with the glass substrate 410 and the silicon wafer 420 is L1; an angle formed by the line L1 and the glass substrate 410 is θ1; and an angle in which the slant face 331 of the substrate holding claw 330 is slanted with respect to a horizontal direction is θ2, in a case where the angle θ1 and the angle θ2 satisfy an inequality θ2<θ1, when the substrate 400 is slid on the slant face 331, only the silicon wafer 420 of the glass substrate 410 and the silicon wafer 420 is put into contact with the slant face 331. In other words, the sharp corner portion 421 of the silicon wafer 420 is slid on the slant face 331. In this case, as shown in FIG. 6B, the corner portion 421 may be caught in the machining marks 334 formed along a direction approximately perpendicular to the slant face 331, which hence causes a failure of the substrate 400 to be fixed or damage to the substrate 400.

On the other hand, according to the substrate holding claw 130 of the present embodiment shown in FIG. 3, the machining marks 134 are formed so as to cross a direction in which the substrate 400 is slid at a comparatively small angle. Hence, as compared with a case where the machining marks 334 are formed so as to cross the direction in which the substrate is slid at a comparatively large angle, like the example in the prior art shown in FIG. 5A and FIG. 5B, the machining marks 134 are hard to operate as stepped portions in which the substrate 400 is caught. Hence, the probability of occurrence of the failure of the substrate 400 to be fixed and damage to the substrate 400, which are caused by the substrate 400 being caught in the machining marks 134, can be suitably reduced. In addition, the surface of the slant face 131 does not need to be finished smoothly by an accurate machining, so the substrate holding claw 130 of the present embodiment can be manufactured at a low cost and at a high productivity.

In the example described above, the crossing angle formed by the direction in which the machining marks 134 are formed and the direction in which the wafer W is slid is 30 degrees, but the crossing angle can be set at an arbitrary angle which is not less than 0 degree and not more than 45 degrees. As the crossing angle is smaller, an effect of reducing the probability of occurrence of the substrate being caught in the machining marks can be further increased. For this reason, it is preferable that the crossing angle is not more than 30 degrees and it is more preferable that the crossing angle is 0 degree.

Figure 7:
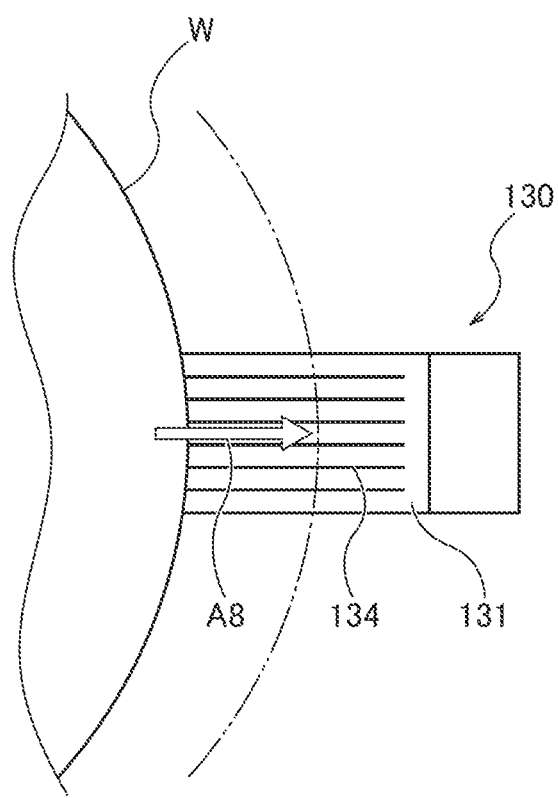
FIG. 7 is an illustrative view to show another example of a relationship between a substrate holding claw and a direction in which a wafer is slid.

The crossing angle is determined by the direction of the machining marks with respect to the slant face of the substrate holding claw, the direction of the substrate holding claw, and the structure of the substrate holding mechanism and the like. For example, in a case where the slant face 131 of the substrate holding claw 130 is arranged in parallel to a direction in which the arms 110, 120 are moved, as shown in FIG. 7, a crossing angle formed by a direction in which the machining marks 134 are formed and a direction A8 in which the wafer W is slid is 0 degree. In other words, the direction in which the machining marks 134 are formed and the direction A8 in which the wafer W is slid are parallel to each other. In this construction, the effect of reducing the probability of occurrence of the substrate being caught in the machining marks can be improved to the maximum.

Figure 8A:
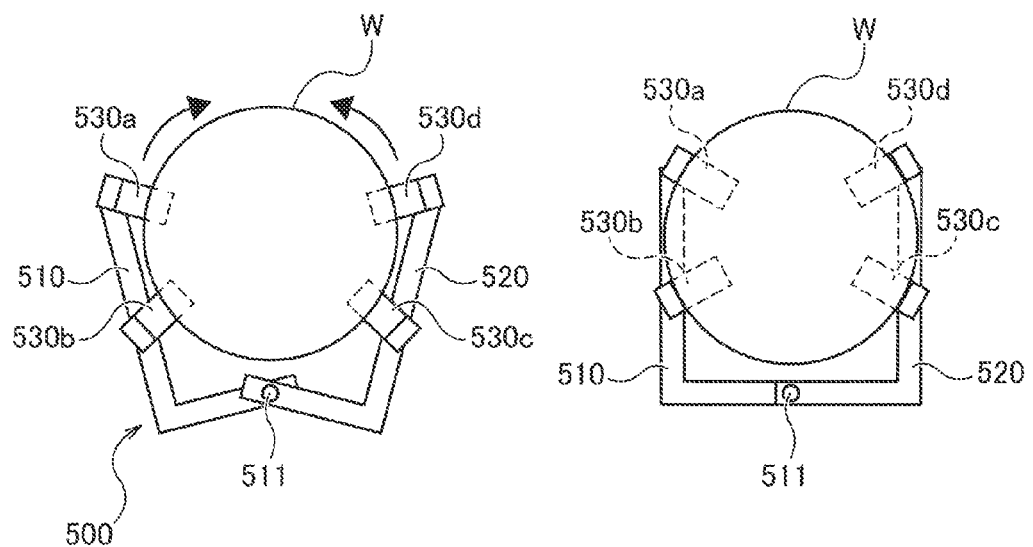
FIGS. 8A, 8B, and 8C are illustrative views to show a schematic construction of another substrate holding mechanism and a direction in which machining marks are formed.
Figure 8B:
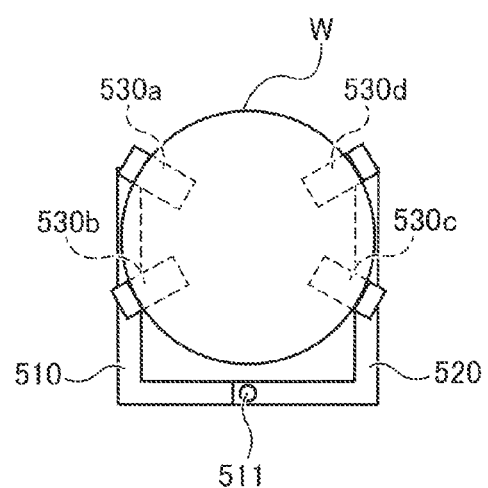
Figure 8C:
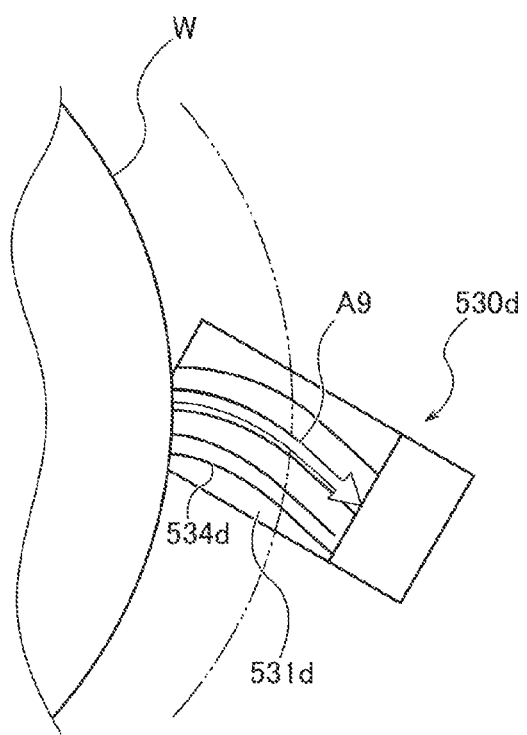

FIGS. 8A, 8B, and 8C show another example of a relationship between the substrate holding claw and the direction in which the wafer is slid. In this example is used a substrate holding mechanism 500 having a structure different from the substrate holding mechanism 100 described above. As shown in FIG. 8A, the substrate holding mechanism 500 includes arms 510, 520. Substrate holding claws 530a to 530d are provided on the arms 510, 520. The respective arms 510, 520 are configured to be rotatable centering a pivot 511 and when the arms 510, 520 are rotated in a direction in which they come near to each other, the substrate holding claws 530a to 530d sandwich and hold the wafer W as shown in FIG. 8B.

In the substrate holding mechanism 500 having this construction, for example, a direction in which the wafer W is slid on the substrate holding claw 530d forms a curved line shown by an arrow A9 in FIG. 8C. In this case, in order to improve the effect of reducing the probability of occurrence of the wafer W being caught in the machining marks to the maximum, as shown in FIG. 8C, a direction in which machining marks 534d are formed on the slant face 531d of the substrate holding claw 530d may be a direction changing curvedly along the direction in which the wafer W is slid (direction shown by the arrow A9). In this way, the machining marks do not always need to be straight but may be formed in a curved shape.

Further, the crossing angle formed by the direction in which the machining marks are formed and the direction in which the wafer W is slid does not necessarily need to be not less than 0 degree and not more than 45 degrees in the whole region of the slant face but may be not less than 0 degree and not more than 45 degrees only in a part of the region. Even in this construction, as compared with the comparative example shown in FIGS. 5A, 5B, an effect of a certain degree can be produced. Still further, the machining marks may be formed in a direction in which the crossing angle formed by the direction in which the machining marks are formed and the direction in which the wafer W is slid is changed, depending on the region of the slant face of the substrate holding claw, within a range which is not less than 0 degree and not more than 45 degrees. The crossing angle may be appropriately set in consideration of the effect produced by the crossing angle and the ease with which the substrate holding claws can be manufactured.

Figure 9A:
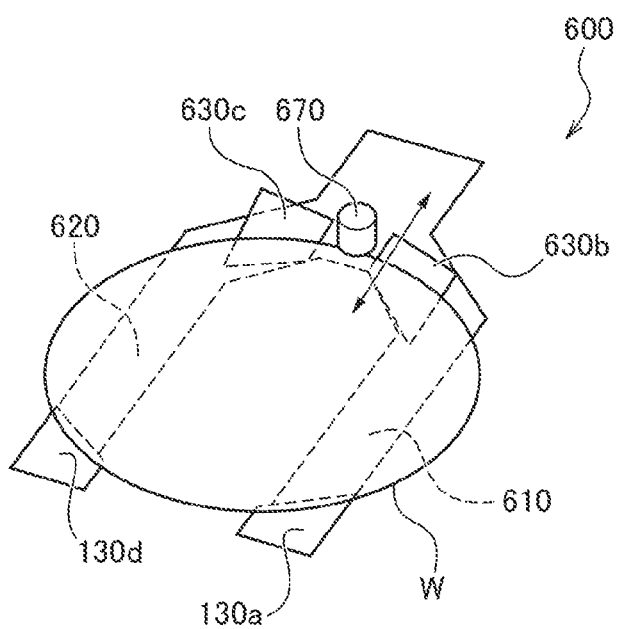
FIGS. 9A and 9B are illustrative views to show a schematic construction of another substrate holding mechanism.
Figure 9B:
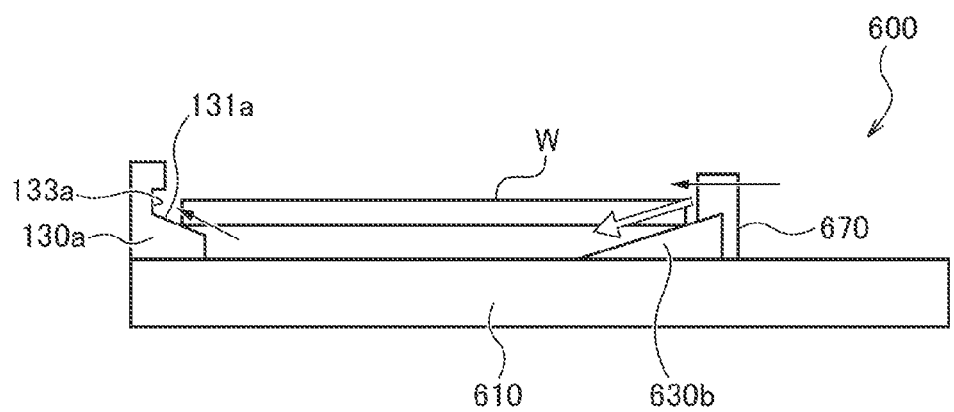

FIGS. 9A and 9B show a substrate holding mechanism 600 (hand portion) used for the transportation robot 22. The substrate holding mechanism 600 includes a pair of arms 610, 620, which are branched from a proximal end portion and extended in parallel to each other, and a clamp pin 670 provided in the proximal end portion of the arms 610, 620. Substrate holding claws 130a, 630b, 630c, 130d are provided on the arms 610, 620. The substrate holding claws 130a, 130d have the construction shown in FIG. 3. The substrate holding claws 630b, 630c include slant faces in which height is decreased toward distal ends of the arms 610, 620. The clamp pin 670 is configured to be movable in a direction in which the arms 610, 620 are extended.

In this substrate holding mechanism 600, the wafer W is arranged on the substrate holding claws 130a, 630b, 630c, 130d and then the clamp pin 670 is moved toward the distal end sides of the arms 610, 620, whereby the wafer W is pushed by the clamp pin 670 and hence is slid on the slant faces 131 of the substrate holding claws 130a, 130d and the slant faces of the substrate holding claws 630b, 630c. Then, finally, the wafer W is held between the faces 133 and the clamp pin 670. Here, the wafer W is moved down on the slant faces of the substrate holding claws 630b, 630c and hence is not caught in the machining marks. Further, the slant faces of the substrate holding claws 130a, 630b, 630c, 130d are shown exaggeratedly in the drawing in such a way that the slant becomes large, but actually these slant faces are set in such a way that a vertical movement and a change in the slant of wafer W fall within in a tolerance range.

In this way, the substrate holding claw 130 described above can be used not only for the turnover devices 31, 41 but also for various kinds of substrate holding mechanisms and substrate transporting devices. Further, the substrate holding claw 130 can be used not only for the substrate polishing device but also for various kinds of semiconductor manufacturing apparatuses handling the substrate. Still further, the substrate holding claw 130 can be used not only for the substrate 400 described above but also for an arbitrary substrate and is suitable for a substrate in which a sharp corner portion is formed at an edge portion thereof.

Up to this point, the embodiments of the present invention have been described on the basis of several embodiments. However, the embodiments of the present invention have been described so as to make the present invention be easily understood and do not limit the present invention. The present invention can be modified and improved without departing from the scope of the spirit of the present invention, and needless to say, equivalents of the present invention are included by the present invention. Further, in a range capable of solving at least a part of the problems described above or in a range of producing at least a part of effects described above, respective constituent elements claimed in the scope of claims and described in the specification can be arbitrarily combined with each other or can be arbitrarily omitted.

What is claimed is:

1. A substrate holding mechanism comprising:
a substrate holding claw for holding the substrate,
wherein the substrate holding claw includes a slant face for sliding the substrate thereon, height of the slant face being increased from the inside of a space for holding the substrate toward the outside of the space,
wherein a machining mark including at least one of a linear mark and substantially parallel marks is formed on the slant face, and
wherein a crossing angle of a direction in which the at least one of the linear mark and the substantially parallel marks is formed and a direction in which the substrate is slid is not less than 0 degree and not more than 45 degrees at least in a partial region of the slant face.

2. The substrate holding mechanism according to claim 1, wherein the crossing angle is not more than 30 degrees.

3. The substrate holding mechanism according to claim 1, wherein the crossing angle is 0 degree.

4. The substrate holding mechanism according to claim 1, wherein the at least one of the linear mark and the substantially parallel marks is formed substantially in parallel to a direction in which the slant face is slanted.

5. A substrate turnover device comprising:
a substrate holding mechanism including a substrate holding claw for holding the substrate,
wherein the substrate holding claw includes a slant face for sliding the substrate thereon, height of the slant face being increased from the inside of a space for holding the substrate toward the outside of the space,
wherein a machining mark including at least one of a linear mark and substantially parallel marks is formed on the slant face, and
wherein a crossing angle of a direction in which the at least one of the linear mark and the substantially parallel marks is formed and a direction in which the substrate is slid is not less than 0 degree and not more than 45 degrees at least in a partial region of the slant face.

6. A substrate transporting device comprising:
a substrate holding mechanism including a substrate holding claw for holding the substrate,
wherein the substrate holding claw includes a slant face for sliding the substrate thereon, height of the slant face being increased from the inside of a space for holding the substrate toward the outside of the space,
wherein a machining mark including at least one of a linear mark and substantially parallel marks is formed on the slant face, and
wherein a crossing angle of a direction in which the at least one of the linear mark and the substantially parallel marks is formed and a direction in which the substrate is slid is not less than 0 degree and not more than 45 degrees at least in a partial region of the slant face.

7. A semiconductor manufacturing apparatus comprising:
a substrate holding mechanism including a substrate holding claw for holding the substrate,
wherein the substrate holding claw includes a slant face for sliding the substrate thereon, height of the slant face being increased from the inside of a space for holding the substrate toward the outside of the space,
wherein a machining mark including at least one of a linear mark and substantially parallel marks is formed on the slant face, and
wherein a crossing angle of a direction in which the at least one of the linear mark and the substantially parallel marks is formed and a direction in which the substrate is slid is not less than 0 degree and not more than 45 degrees at least in a partial region of the slant face.

8. A substrate holding mechanism comprising:
a substrate holding claw for holding the substrate,
wherein the substrate holding claw includes a slant face for sliding the substrate thereon, height of the slant face being increased from the inside of a space for holding the substrate toward the outside of the space,
wherein a machining mark including at least one of a linear mark and substantially parallel marks is formed on the slant face, and
wherein a crossing angle of a direction in which the at least one of the linear mark and the substantially parallel marks is formed and a direction in which the substrate is slid is not less than 0 degree and not more than 45 degrees at least in a partial region of the slant face, and
wherein the at least one of the linear mark and the substantially parallel marks is formed substantially in parallel to a direction in which the slant face is slanted.

* * * * *